(12) United States Patent
Nie et al.

(10) Patent No.: US 10,950,780 B2
(45) Date of Patent: Mar. 16, 2021

(54) MANUFACTURING METHOD FOR ELECTRODE OF HIGH-TEMPERATURE PIEZOELECTRIC ELEMENT

(71) Applicant: Xiamen Niell Electronics Co., Ltd., Fujian (CN)

(72) Inventors: Yongzhong Nie, Fujian (CN); Xuejun Chen, Fujian (CN); Hai Lin, Fujian (CN)

(73) Assignee: XIAMEN NIELL ELECTRONICS CO., LTD., Fujian (CN)

( * ) Notice: Subject to any disclaimer, the term of this patent is extended or adjusted under 35 U.S.C. 154(b) by 242 days.

(21) Appl. No.: 15/985,171

(22) Filed: May 21, 2018

(65) Prior Publication Data

US 2018/0269379 A1      Sep. 20, 2018

Related U.S. Application Data

(62) Division of application No. 14/899,863, filed as application No. PCT/CN2013/079756 on Jul. 22, 2013, now abandoned.

(30) Foreign Application Priority Data

Jun. 18, 2013   (CN) .......................... 201310240971.9

(51) Int. Cl.
*H01L 41/29*      (2013.01)
*H01L 41/047*     (2006.01)
(Continued)

(52) U.S. Cl.
CPC .......... *H01L 41/29* (2013.01); *H01L 41/0471* (2013.01); *H01L 41/0478* (2013.01); *H01L 41/257* (2013.01); *H01L 41/297* (2013.01)

(58) Field of Classification Search
CPC . H01L 41/29; H01L 41/0471; H01L 41/0478; H01L 41/257; H01L 41/297
See application file for complete search history.

(56) References Cited

U.S. PATENT DOCUMENTS 2,388,242 A    11/1945  Arndt, Jr.
RE27,116 E     4/1971   Miller et al.
(Continued)

FOREIGN PATENT DOCUMENTS

CN         1435899 A     8/2003
CN       101009357 A     8/2007
(Continued)

*Primary Examiner* — Livius R. Cazan
(74) *Attorney, Agent, or Firm* — Dinsmore & Shohl LLP

(57) ABSTRACT

A manufacturing method for an electrode of a high-temperature piezoelectric element, comprises: coating traditional conductive slurry on surfaces of a molded piezoelectric material (1); then polarizing the piezoelectric material (1); and then removing the coating of conductive slurry (2) on the surfaces there of, and connecting the piezoelectric material to outside electrode lead wires (3) to output a signal generated by piezoelectric effect thereof. A structure of a high-temperature piezoelectric element, comprises polarized piezoelectric material (1), wherein the coating of metallic conductive slurry (2) is removed from the surfaces of the polarized piezoelectric material (1) and the surfaces of the polarized piezoelectric material (1) is connected to electrode lead wires (3) to output a signal generated by piezoelectric effect thereof. By removing the traditional coating of slurry for electrode, it is avoided that the output resistance of the piezoelectric element is reduced because of the high temperature diffusion of electrode material at a high temperature, and the thermal performance of the piezoelectric element is improved. By adding diamond or graphite coating as electrode, the sensitivity of outputting charges of the piezoelectric element is improved.

3 Claims, 2 Drawing Sheets

(51) Int. Cl.
*H01L 41/257* (2013.01)
*H01L 41/297* (2013.01)

(56) References Cited

U.S. PATENT DOCUMENTS

| | | |
|---|---|---|
| 5,929,555 A | 7/1999 | Sugimoto et al. |
| 6,577,044 B1 | 6/2003 | Li |
| 7,368,862 B2 | 5/2008 | Pelrine et al. |
| 7,633,210 B2 | 12/2009 | Ono et al. |
| 2003/0154584 A1 | 8/2003 | Aratake et al. |
| 2009/0047445 A1* | 2/2009 | Schneider ............... H01L 41/45 427/562 |
| 2011/0074516 A1 | 3/2011 | Sone et al. |
| 2013/0270969 A1 | 10/2013 | Sato |

FOREIGN PATENT DOCUMENTS

| | | |
|---|---|---|
| CN | 101051668 A | 10/2007 |
| CN | 101550029 A | 10/2009 |
| CN | 101834268 A | 9/2010 |
| DE | 102011081278 A1 | 2/2013 |
| JP | S56160087 A | 12/1981 |
| JP | H0387076 A | 4/1991 |
| JP | H11317552 A | 11/1999 |
| JP | 03087076 B2 | 9/2000 |
| JP | 2009242188 A | 10/2009 |
| WO | 2012115230 A1 | 8/2012 |

\* cited by examiner

MANUFACTURING METHOD FOR ELECTRODE OF HIGH-TEMPERATURE PIEZOELECTRIC ELEMENT

CROSS-REFERENCE TO RELATED APPLICATIONS

This application is a divisional of U.S. patent application Ser. No. 14/899,863 filed Dec. 18, 2015, now abandoned, which is the U.S. National Phase of PCT/CN2013/079756 filed Jul. 22, 2013 which claims priority of Chinese Application No. 201310240971.9 filed Jun. 18, 2013; the entire content of each of which are incorporated herein by reference.

FIELD OF THE INVENTION

The present invention relates to the field of piezoelectric sensor technology, and in particular relates to a manufacturing method for an electrode of a high-temperature piezoelectric element and a structure of a piezoelectric element.

DESCRIPTION OF THE PRIOR ART

The piezoelectric ceramics has been widely used in various fields of sensors and micro-actuators. In most cases, if sensors are applied at room temperature or applied in an engine (which is usually less than 400 degrees Celsius), people can use silver slurry or gold-palladium slurry (which is usually used at a temperature above 300 degrees Celsius but below 500 degrees Celsius). But with the development of science and technology, people also need to measure various physical quantities at high-temperature regions such as aero-engines, gas turbine engines, rocket exhaust nozzle and etc., and in these regions the temperature is much higher than the above mentioned conventional slurry electrode canendure. At this time, if we still use the traditional slurry or the sputtering or evaporation process, it will lead to high-temperature diffusion of electrode material so that the he output resistance of the functional ceramic materials (such as piezoelectric ceramics) will be reduced, but people hope that the bigger output resistance of this kind of products, the better.

SUMMARY OF THE INVENTION

In order to overcome the above problem, the present invention provides a manufacturing method for an electrode of a high-temperature piezoelectric element and a structure of a piezoelectric element, wherein the coating of conventional electrode slurry is removed, and the resistance is relatively stable in a high-temperature environment.

To achieve the above object, the present invention presents a technical solution as follows: a manufacturing method for an electrode of a high-temperature piezoelectric element comprising the following steps: a) molding piezoelectric material according to specifications; b) coating, sputtering or evaporating traditional conductive slurry on upper and lower surfaces of the molded piezoelectric material; c) polarizing the piezoelectric material coated with the conductive slurry; d) removing the coating of the conductive slurry on the surfaces of the piezoelectric material; e) connecting electrode lead wires on the surfaces of the piezoelectric material, to output a signal generated by piezoelectric effect thereof.

Further, it further comprises step f) connecting the piezoelectric materials which have the coatings removed by way of stacking or series-parallel connection.

Further, it further comprises spraying diamond or graphite on the surfaces of the piezoelectric material which has the coating removed to form electrodes, and adjusting the roughness of the sprayed surfaces.

Further, adjust the roughness of the sprayed surfaces is by means of grinding.

Further, it further comprises connecting the piezoelectric materials which have diamond or graphite electrodes sprayed on by way of stacking or series-parallel connection.

Further, the conductive slurry is metallic slurry; removing the coating of the conductive slurry is by chemical etching or in a physical manner.

A structure of a piezoelectric element of the invention, comprises polarized piezoelectric material which has coating of metallic conductive slurry removed from its surfaces; the surfaces of the polarized piezoelectric material are connected to electrode lead wires, to output a signal generated by piezoelectric effect thereof.

Further, diamond or graphite are sprayed on the surfaces of the polarized piezoelectric material to form electrodes.

Further, the structure of the piezoelectric element comprises multiple layers of the piezoelectric material, the respective piezoelectric materials are connected by way of stacking or series-parallel connection.

The beneficial effects of the present invention are that by removing the traditional coating of slurry for electrode, it is avoided that the output resistance of the piezoelectric element is reduced because of the high temperature diffusion of electrode material at a high temperature, and the thermal performance of the piezoelectric element is improved; and by adding diamond or graphite coating as an electrode, the sensitivity of outputting charges of the piezoelectric element is improved.

Reference numbers: 1. a piezoelectric material; 2. a coating of conductive slurry; 3. electrode lead wires; 4. graphite coating.

DETAILED DESCRIPTION OF THE PREFERRED EMBODIMENTS

In conjunction with the drawings and specific embodiments, the present invention is further described below.

Figure 1:
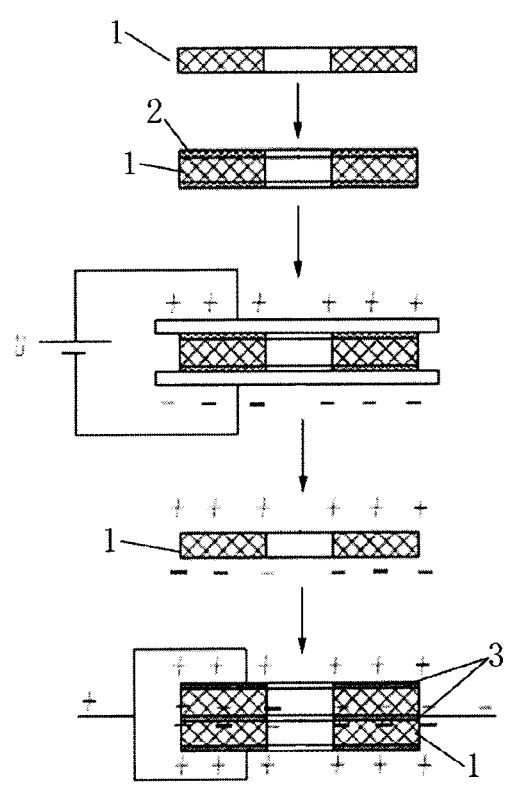
FIG. 1 is a schematic view of the process of manufacturing an electrode of a piezoelectric element of the invention.

As shown in FIG. 1, embodiment one of a manufacturing method for an electrode of a high-temperature piezoelectric element comprises the following steps: a) molding piezoelectric material 1 according to specifications; b) coating, sputtering or evaporating traditional conductive slurry on upper and lower surfaces of the molded piezoelectric material 1; c) polarizing the piezoelectric material 1 coated with the conductive slurry; d) removing the coating 2 of the conductive slurry on the surfaces of the piezoelectric material 1; e) connecting electrode lead wires 3 on the surfaces of the piezoelectric material 1, to output a signal generated by piezoelectric effect thereof. For example, taking piezoelectric ceramics as example, the method comprises molding the piezoelectric ceramics according to the actual design we need, on the upper and lower surfaces of the piezoelectric ceramics coating, sputtering or evaporating traditional conductive slurry, such as silver slurry or gold-palladium slurry and the like, then polarizing the piezoelectric ceramic, removing the coating 2 of the conductive slurry on the surfaces of the piezoelectric ceramics by chemical etching or in a physical manner after polarization, and then using conductive electrodes outside to directly output the signal generated by piezoelectric effect thereof, for example by directly connecting to the surfaces of the piezoelectric material with electrode lead wires 3 to output the signal generated by piezoelectric effect thereof. Further, multiple piezoelectric materials 1 having coatings removed can be connected by way of stacking or series-parallel connection, and the signal generated by piezoelectric effect thereof is outputted via electrode lead wires 3. By removing the traditional coating of electrode slurry, it can be avoided that the output resistance of the piezoelectric element is reduced because of high temperature diffusion of electrode material at a high temperature, and the thermal performance of the piezoelectric element is improved.

Figure 2:
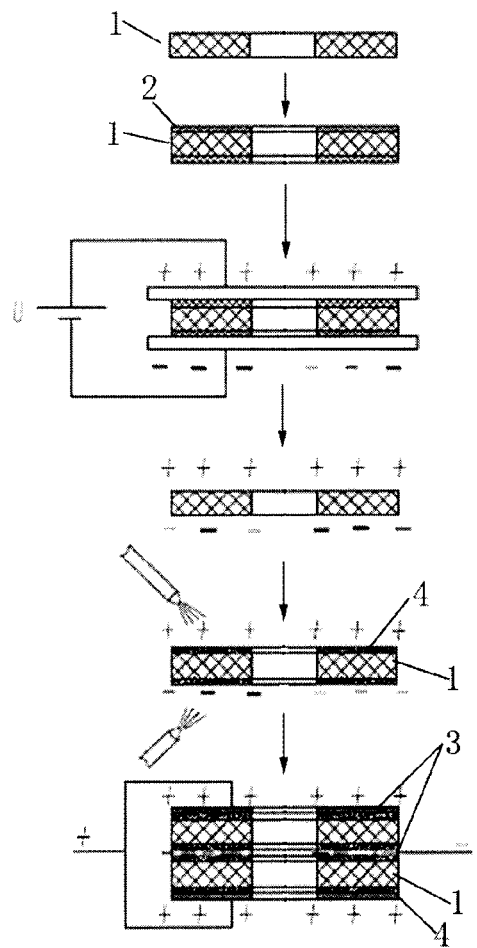
FIG. 2 is a schematic view of the process of manufacturing an electrode of a piezoelectric element of the invention.

As shown in FIG. 2, embodiment two of a manufacturing method for an electrode of a high-temperature piezoelectric element of the invention, differs from embodiment one in that diamond or graphite is spraying on the surfaces of the piezoelectric material 1 to form electrodes when the coating 2 of the conductive slurry is removed, and the roughness of the sprayed surfaces is adjusted. For example, the roughness of the surfaces of the sprayed diamond coating or graphite coating 4 can be adjusted by means of grinding. Multiple piezoelectric materials 1 having diamond or graphite coating 4 sprayed on can be connected by way of stacking or series-parallel connection, and the signal generated by piezoelectric effect thereof is outputted via electrode lead wires 3. Adding diamond or graphite coating 4 as electrodes can improve the sensitivity of outputting charges of the piezoelectric element.

Figure 3:
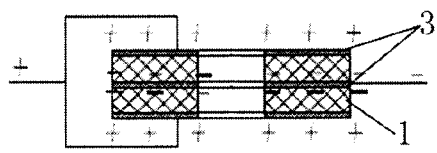
FIG. 3 is a schematic view of structure one of a piezoelectric element of the invention.
Figure 4:
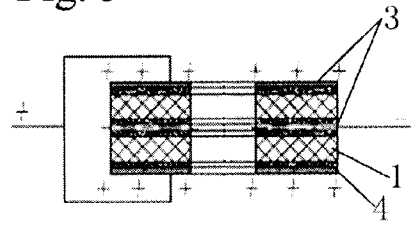
FIG. 4 is a schematic view of structure two of a piezoelectric element of the invention.

FIGS. 3 and 4 are embodiment one and two of a structure of a high-temperature piezoelectric element of the present invention.

As shown in FIG. 3, the structure of a high-temperature piezoelectric element comprises polarized piezoelectric material 1, such as polarized piezoelectric ceramic, the polarized piezoelectric material 1 has the coating 2 of the metallic conductive slurry removed from its surfaces; and the surfaces of the polarized piezoelectric material 1 are connected to electrode lead wires 3, to output the signal generated by piezoelectric effect thereof. Unlike the prior art, the structure has the traditional coating 2 of slurry for electrode removed, such that the problem that the output resistance of the piezoelectric element is reduced because of high temperature diffusion of electrode material at a high temperature is solved, and the thermal performance of the piezoelectric element is improved.

The structure of the piezoelectric element can comprise multiple layers of the piezoelectric material 1, and the respective piezoelectric materials are connected by way of stacking or series-parallel connection, and connected to electrode lead wires 3 to output the signal generated by piezoelectric effect thereof.

The structure of the piezoelectric element shown in FIG. 4 differs from the above mentioned structure in that diamond or graphite coating 4 is sprayed on the surfaces of the polarized piezoelectric materials 1 to form electrodes, to improve the sensitivity of outputting charges of the piezoelectric element.

The structure of the piezoelectric element can also comprise multiple layers of the piezoelectric material 1 having diamond or graphite coating 4 sprayed on, and the respective piezoelectric material 1 are connected by way of stacking or series-parallel connection, and connected to electrode lead wires 3 to output the signal generated by piezoelectric effect thereof.

Although the combination of specific preferred embodiments of the present invention shown and described, those skilled in the art would understand that, within the spirit and scope of the appended claims without departing from the invention as defined in the form and details various variations of the present invention to make, both the scope of the invention.

The invention claimed is:
1. A manufacturing method for a piezoelectric element, comprising the following steps:
   a) molding piezoelectric material according to specifications;
   b) coating, sputtering or evaporating a conductive slurry on upper and lower surfaces of the molded piezoelectric material;
   c) polarizing the piezoelectric material coated with the conductive slurry;
   d) removing the coating of the conductive slurry from the surfaces of the piezoelectric material; then spraying graphite on the upper and lower surfaces of the piezoelectric material;
   e) connecting electrode lead wires on surfaces of the graphite sprayed on the piezoelectric material, to output a signal generated by a piezoelectric effect thereof.

2. The manufacturing method for a piezoelectric element according to claim 1, wherein it further comprises a step of adjusting a roughness of the sprayed surfaces by means of grinding.

3. The manufacturing method for a piezoelectric element according to claim 1, wherein the conductive slurry is metallic slurry; removing the coating of the conductive slurry is by chemical etching or in a physical manner.

* * * * *